United States Patent
Sperling et al.

(10) Patent No.: US 10,931,269 B1
(45) Date of Patent: Feb. 23, 2021

(54) EARLY MODE PROTECTION FOR CHIP-TO-CHIP SYNCHRONOUS INTERFACES

(71) Applicant: International Business Machines Corporation, Armonk, NY (US)

(72) Inventors: Michael Sperling, Poughkeepsie, NY (US); Pawel Owczarczyk, Highland, NY (US); Chad Andrew Marquart, Austin, TX (US); Douglas Malone, Pleasant Valley, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/591,883

(22) Filed: Oct. 3, 2019

(51) Int. Cl.
*H03K 5/135* (2006.01)
*H04L 7/00* (2006.01)
*H03K 5/00* (2006.01)

(52) U.S. Cl.
CPC .......... *H03K 5/135* (2013.01); *H04L 7/0008* (2013.01); *H03K 2005/00019* (2013.01)

(58) Field of Classification Search
CPC .......... H03K 5/135; H03K 2005/00019; H04L 7/0008
USPC .................. 327/276; 375/354, 355
See application file for complete search history.

(56) References Cited

U.S. PATENT DOCUMENTS

| | | | | |
|---|---|---|---|---|
| 6,202,168 B1 * | 3/2001 | Saito | ........................ | H04L 7/033 713/400 |
| 6,813,724 B2 * | 11/2004 | Saito | ..................... | G06F 13/423 327/149 |
| 7,486,752 B1 * | 2/2009 | Kwasniewski | ......... | H04L 7/033 375/354 |
| 8,045,663 B2 * | 10/2011 | Bae | ......................... | G11C 5/063 375/355 |
| 8,942,333 B2 * | 1/2015 | Kumar | ................... | G01R 25/04 375/354 |
| 9,490,787 B1 * | 11/2016 | Kho | ........................ | H03K 5/135 |
| 10,015,025 B2 * | 7/2018 | Ahn | ...................... | G11C 7/1087 |
| 2002/0181633 A1 | 12/2002 | Trans | | |
| 2003/0217301 A1 * | 11/2003 | Levy | ...................... | H04L 7/0008 713/400 |
| 2006/0061401 A1 * | 3/2006 | Shiratake | .................. | G06F 1/10 327/291 |
| 2014/0241465 A1 * | 8/2014 | Itoigawa | ............. | H04L 25/0272 375/316 |
| 2014/0368243 A1 * | 12/2014 | Kim | ....................... | H03K 5/135 327/158 |

OTHER PUBLICATIONS

Texas Instruments Incorporated, Synchronized Multi-Transmitter Design: Method of Time-Aligning Multiple DAC3xJ8xs in JESD204B Environment, TI Designs, Mar. 2016, pp. 1-28.

* cited by examiner

*Primary Examiner* — Tomi Skinbinski
(74) *Attorney, Agent, or Firm* — Cantor Colburn LLP; William Kinnaman

(57) ABSTRACT

Aspects of the invention include a process for receiving data and a first clock signal of a first chip and a second clock signal of a second chip, the data being received on a data path and the first clock signal being received on a clock signal path, and determining that the first clock signal is arriving before the second clock signal by a difference quantity. Also, the process includes adding delay to the data path and the clock signal path according to the difference quantity.

20 Claims, 6 Drawing Sheets

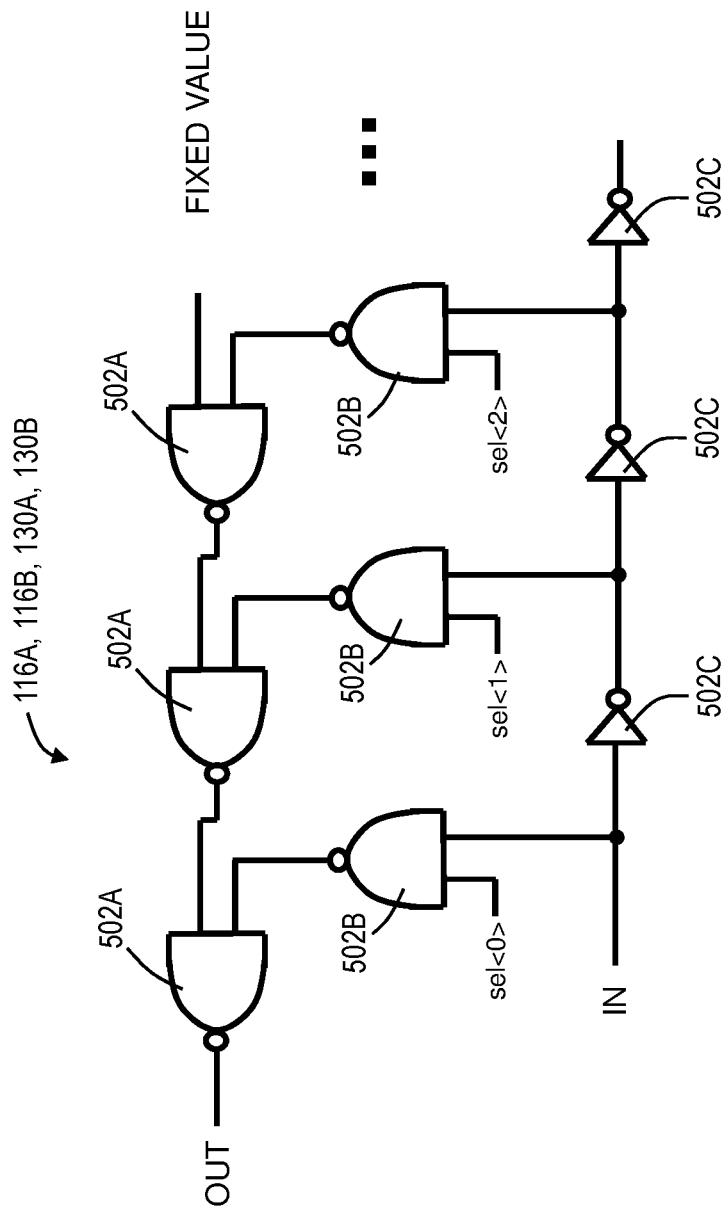

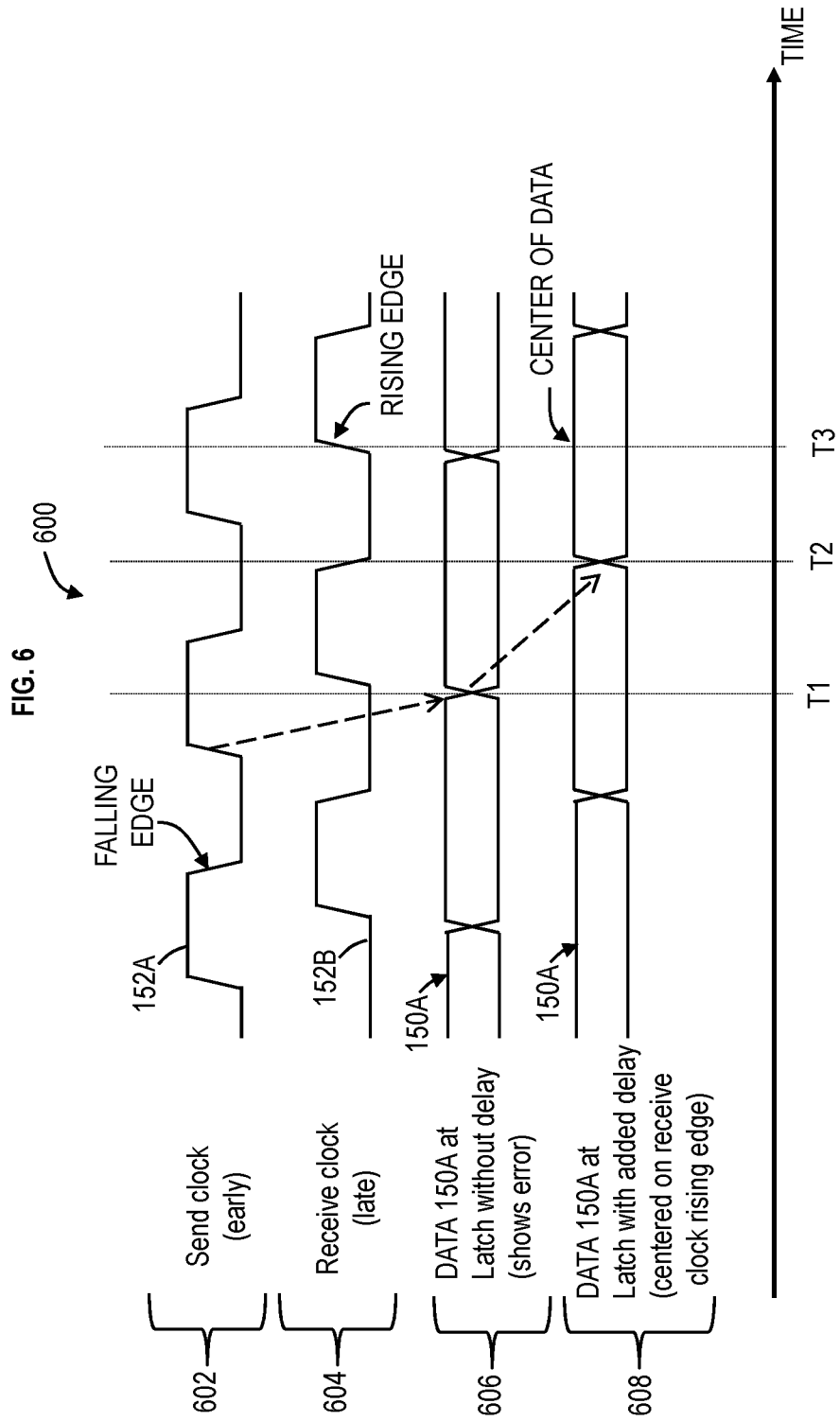

EARLY MODE PROTECTION FOR CHIP-TO-CHIP SYNCHRONOUS INTERFACES

BACKGROUND

The present invention generally relates to communication between chips, and more specifically, to early mode protection for chip-to-chip synchronous interfaces.

In electronics and especially synchronous digital circuits, a clock signal is a particular type of signal that oscillates between a high and a low state and is used to coordinate actions of digital circuits. A clock signal is produced by a clock generator also referred to as clock source. Although more complex arrangements are used, the most common clock signal is in the form of a square wave with a 50% duty cycle, usually with a fixed, constant frequency. Circuits using the clock signal for synchronization may become active at either the rising edge, falling edge, or, in the case of double data rate, both in the rising and in the falling edges of the clock cycle.

SUMMARY

Embodiments of the present invention are directed to early mode protection for chip-to-chip synchronous interfaces. A non-limiting example method includes receiving data and a first clock signal of a first chip and a second clock signal of a second chip, the data being received on a data path and the first clock signal being received on a clock signal path. Also, the method includes determining that the first clock signal is arriving before the second clock signal by a difference quantity and adding delay to the data path and the clock signal path according to the difference quantity.

A non-limiting example apparatus includes a first chip and a second chip. The apparatus includes a detect module of the second chip configured to receive a first clock signal of the first chip and a second clock signal of the second chip, data being associated with a data path and the first clock signal being associated with a clock signal path. The detect module is configured to determine that the first clock signal is arriving before the second clock signal by a difference quantity and add delay to the data path and the clock signal path according to the difference quantity.

A non-limiting example apparatus includes a variable delay module on a data path for data and a replica variable delay module on a clock signal path for a first clock signal of a first chip. Also, the apparatus includes a detect module coupled to the variable delay module and the replica variable delay module, the detect module being configured to determine that the first clock signal is arriving before a second clock signal of a second chip by a difference quantity. The detect module is configured to add delay to the variable delay module and the replica variable delay module according to the difference quantity.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 5 illustrates a block diagram of example variable delay modules and example replica variable delay modules in accordance with one or more embodiments of the present invention; and FIG. 6 illustrates a block diagram of example timing diagram in accordance with one or more embodiments of the present invention.

The diagrams depicted herein are illustrative. There can be many variations to the diagrams or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

One or more embodiments of the present invention address the problem of sending data between two chips with varying power supply (VDD) values due to differing workloads. Data is being sent synchronously between the two chips which have clocks running at the same frequency which should be in phase alignment but may be misaligned due to the different VDD values.

For example, in a short period of time, for example, 10's of nanoseconds, the chips can change from having no difference in VDD to having over 100 millivolts (mV) of difference. This would cause the clocks to misalign and if the interface is too fast the system could have an early mode problem. An early mode problem is one where the clock signal of the sending chip is earlier than the clock signal of the receiving chip. The early mode problem can cause errors in capturing the data being sent from the sending chip to the receiving chip if the data is sent prior to the capture phase (e.g., via a latch) of the clock signal on the receiving chip.

One or more embodiments of the present invention address one or more of the above-described shortcomings of the prior art by providing early mode protection for chip-to-chip interfaces. The invention detects the difference between a clock signal on a sending chip and a clock signal on a receiving chip and delays the data at the receiving chip based on the detected difference.

Figure 1:
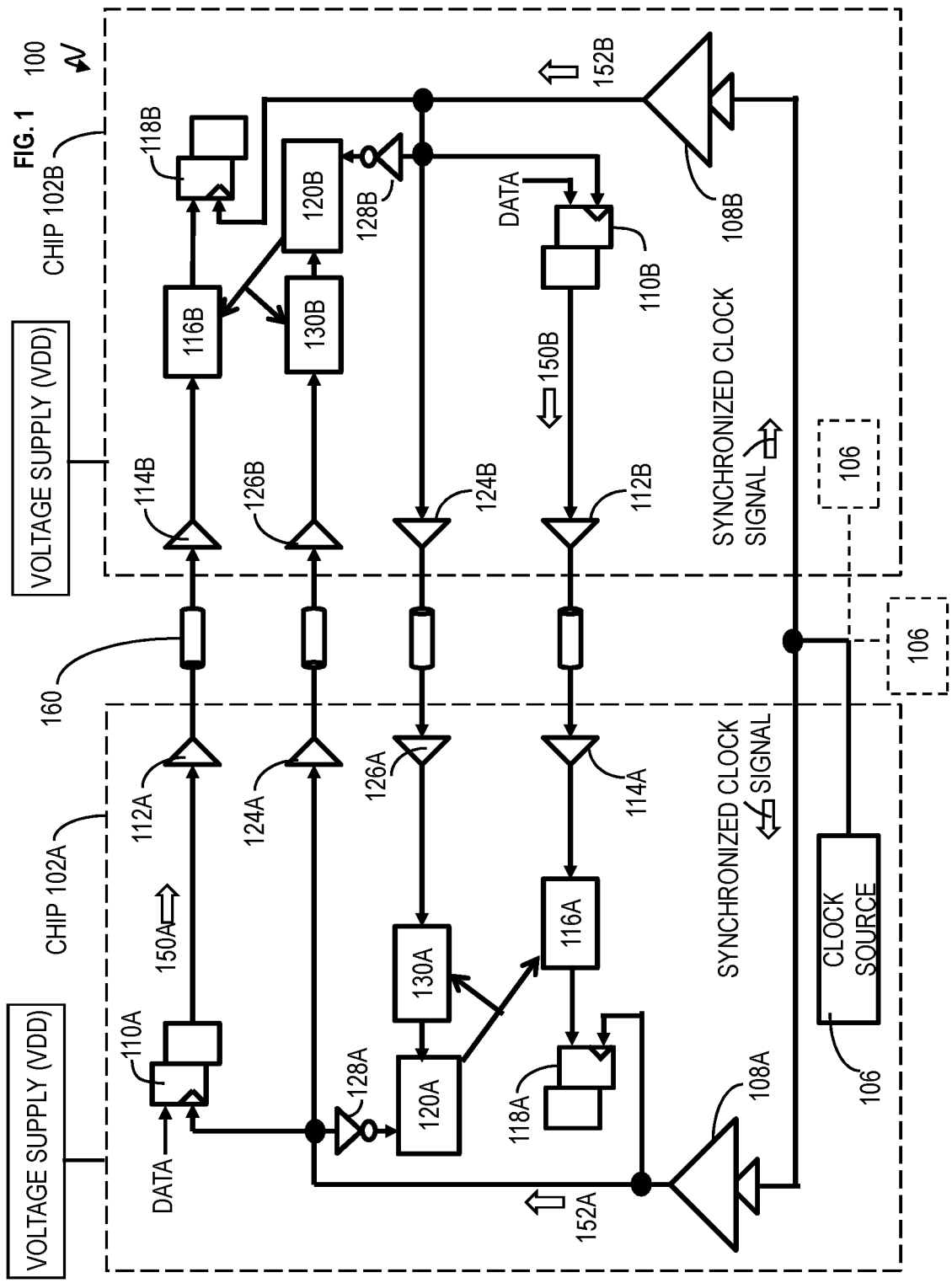
FIG. 1 illustrates a block diagram of components of a circuit for a chip-to-chip interface in accordance with one or more embodiments of the present invention.

Turning now to FIG. 1, a circuit 100 for a chip-to-chip interface is generally shown in accordance with one or more embodiments of the present invention. The circuit 100 includes two separate chips, for example, chip 102A and chip 102B, which synchronously communicate by sending and receiving data over channels 160. Each chip 102A and 102B is an integrated circuit (IC). An integrated circuit or monolithic integrated circuit (also referred to as an IC, a chip, or a microchip) is a set of electronic circuits on one small flat piece of semiconductor material that is normally silicon. The chips 102A and 102B include various components including large numbers of transistors which are utilized to form various electronic devices.

The channels 160 can be, for example, metal interconnects, traces, etc., electrically connecting chips 102A and 102B to one another for sending and receiving signals. Having synchronous communications or synchronous interfaces between chips 102A and 102B means that the chips 102A and 102B use the same clock, for example, clock source 106 to produce a synchronized clock signal, and the chips launch/send data on one edge (e.g., rising edge) of the clock signal and capture on the next edge (e.g., next rising edge) of the clock signal. The clock source 106 can be on chip 102A. Optionally, the clock source 106 can be on chip 102B or off chip, as represented with dashed lines for the clock source 106. The clock source 106 is the clock generator for both chips 102A and 102B.

The clock source 106 is coupled to a clock tree 108A on chip 102A and a clock tree 108B on chip 102B. The clock tree is a clock distribution network within a system or hardware design, and it includes the clocking circuitry and devices from the clock source (e.g., from the clock source 106) to destination. The complexity of the clock tree and the number of clocking components used depends on the hardware design.

For explanation purposes, an example scenario is discussed below describing chip 102A as the sending chip and chip 102B as the receiving chip although it should be understood that the reverse is also true by analogy because both chips 102A and 102B are configured to function as sending and receiving chips. Particularly, both chips 102A and 102B can be simultaneously sending and receiving their respective data 150A and 150B and respective clock signals 152A and 152B. In the example scenario, the sending chip 102A sends data to receiving chip 102B. On the sending chip 102A, the clock tree 108A passes a clock signal 152A to latch 110A, early/late detect module 120A, latch 118A, and driver 124A. Concurrently, on the receiving chip 102B, the clock tree 108A passes a clock signal 152B to latch 110B, early/late detect module 120B, latch 118B, and driver 124B. Based on the clock signal received by the latch 110A, the latch 110A launches data 150A and the data passes through driver 112A which buffers the signal before going off chip. The data 150A passes through channel 160 before reaching the receiving chip 102B.

On the receiving chip 102B, the data 150A passes through receiver 114B before reaching a variable delay module 116B. The variable delay module 116B includes a plurality of delay elements and switches, where the switches are configured to add or remove delay elements in the delay line, thereby correspondingly increasing or decreasing the amount of delay added to the timing of data 150A reaching the latch 118B on chip 102B. An example variable delay module is discussed further in FIG. 5. Simultaneously, the clock signal 152A is being passed from clock tree 108A to driver 124A on the chip 102A. The clock signal 152A for the sending chip 102A is passed to receiving chip 102B via channel 160. On receiving chip 102B, a receiver 126B receives the clock signal 152A for chip 102A. The receiver 126B can pass the clock signal 152A to a replica variable delay module 130B in preparation for the early/late detect module 120B to compare the clock signal 152A to the clock signal 152B. The clock signal 152A passes through the replica variable delay module 130B before reaching the early/late detect module 120B. The replica variable delay module 130B may initially be off or set to 0, until the delay is set by the early/late detect module 120B. Particularly, the replica variable delay module 130B is set by the early/late detect module 120B to replicate or mirror the delay set in variable delay module 116B. The early/late detect module 120B receives the clock signal 152B, via an inverter 128B which flips (i.e., inverts) the clock signal 152B, from the clock tree 108B in preparation for the early/late detect module 120B to make the comparison. The early/late detect module 120B is configured to compare the clock signal 152A of sending chip 102A to the clock signal 152B of receiving chip 102B and determine the difference (e.g., difference quantity 250 in FIG. 2). Early mode for chip-to-chip interfaces relates to the data from a sending chip being received earlier in time than the clock signal of the receiving chip, thereby causing a memory element, such as the latch 118B, to fail to capture (i.e., open too late) and/or capture at the wrong time (i.e., still remain open from capturing previously sent data but closing before capturing all of the currently sent data).

When the early/late detect module 120B determines that the rising edge of clock signal 152A that has been received on chip 102B is received earlier than the falling edge of clock signal 152B, the early/late detect module 120B delays the data 150A having been received at the receiving chip 102B based on the detected difference. Although the inverter 128B inverts the clock signal 152B prior to reaching the early/late detect module 120B, the falling edge of clock signal 152B becomes a rising edge at the early/late detect module 120B for comparison purposes. Based on the difference when the rising edge of clock signal 152A received on chip 102B (and consequently the transition of data 150A) of sending chip 102A is earlier than the falling edge of clock signal 152B of receiving chip 102B (i.e., the falling edge appears as and/or is interpreted as a rising edge of clock signal 152B for comparison by the early/late detect module 120B), the early/late detect module 120B is configured to delay or add delay to the variable delay module 116B and mirror the same amount of delay in the replica variable delay module 130B. To add delay, the early/late detect module 120B is configured to power on (and/or select) a number of delay elements in both the variable delay module 116B and replica variable delay module 130B until the desired amount of delay is achieved (e.g., according to the difference quantity 250 in FIG. 2) between the clock signal 152A and 152B).

Figure 2:
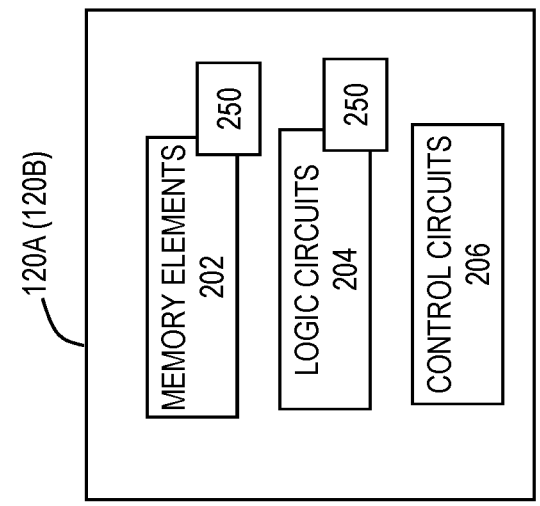
FIG. 2 illustrates a block diagram of example early/late detect modules in accordance with one or more embodiments of the present invention.

FIG. 2 illustrates a block diagram of an example early/late detect module 120A, 120B according to embodiments of the invention. Continuing the example scenario above, the early/late detect module 120B on chip 102B receives both clock signal 152A received on chip 102B and clock signal 152B. Logic circuits 204 are configured to determine the difference quantity 250 between clock signals 152A and 152B, and the control circuits 206 are configured to output control signals to the variable delay module 116B and replica variable delay module 130B to power on (and/or select) the proper number of delay elements for adding the requisite delay according to the difference quantity 250. The difference quantity 250 is the phase misalignment between clock signals 152A and 152B which corresponds to the difference in time and may be stored in memory elements 202. The early/late detect module 120A, 120B is configured to determine the phase mis-alignment between the halfway point of the cycle or between rising and falling edges (e.g., subtract the earlier time from the later time). Accordingly, the early/late detect module 120B at the receiving chip 102B detects the difference quantity 250 between clock signals 152A and 152B and delays the data 150A from reaching the latch 118B until clock signal 152B is in the capture phase (i.e., until the clock signal 152B causes the latch 118B to open to store the data 150A) which is the rising edge. In this manner, one or more embodiments of the invention provide early mode protection.

Turning to FIG. 6, a timing diagram 600 is illustrated according to one or more embodiments. In FIG. 6, view 602 depicts an example waveform of the clock signal 152A of the (sending) chip 102A and view 604 depicts an example waveform of the clock signal 152B of the (receiving) chip 102B, where both clock signal 152A having been received on the chip 102B and clock signal 152B are received at early/late detect module 120B on chip 102B. The waveforms in both views 602 and 604 have the same frequency from clock source 106. View 606 depicts an example waveform of the data 150A received at the latch 118B on chip 102B without added delay. Latches can be either rising or falling edge sensitive, which means that the latches can be designed to open/capture data on either the rising edge or falling edge of the clock signal. In this example, it is assumed that the latches 118A and 118B capture data on the rising edge, thus being rising edge latches, although falling edge latches apply by analogy and can be utilized in accordance with embodiments. Returning to FIG. 6, ideally, the (sending) clock signal 152A received on chip 102B should have its rising edge aligned to the falling edge of the (receiving) clock signal 152B, which will cause the data 150A to be captured in the center (i.e., the bubble of the data) of the clock cycle. The vertical line at time T1 shows that the data 150A in view 606 is overriding the previous cycle data, because the rising edge of (receiving) clock signal 152B occurs immediately after the transitional part of the data 150A; this is the case at the latch 118B without adding the delay. View 608 depicts the data 150A after phase alignment in which the variable delay module 116B (and replica variable delay module 130B) adds delay to account for the difference quantity 250 between the rising edge of clock signal 152A received at chip 102B, and the falling edge of clock signal 152B. Because of the added delay, the center of the data 150A in view 608 coincides with the center of the rising edge of the (receiving) clock signal 152B in view 602, which is the capture point of the latch 118B. The vertical line at time T2 shows how the transition of the data 150A is delayed until the falling edge of the receive clock 152B, which results in the centering of the data 150A within the rising clock signal 152B, at time T3.

Continuing the example scenario, the clock signal 152A also has the same delay as the data 150A because the same delay is added to both the variable delay module 116B and replica variable delay module 130B. Accordingly, the early/late detect module 120B can now compare the clock signal 152A having been delayed to the clock signal 152B. The circuit 100 illustrates an example of adding delay to the data path so that even if the voltage supply (VDD) of the receiving chip 102B moves rapidly, the latch 118B of receiving chip 102B is still capturing in the middle of the data 150A which coincides with the rising edge of clock signal 152B at the latch 118B. The difference quantity 250 detected by the early/late detect module 120B at the receiving chip 102B is the difference in time between the rising edge of clock signal 152A received at chip 102B, and the falling edge of clock signal 152B (i.e., the falling edge appears as and/or is interpreted as a rising edge of clock signal 152B for comparison by the early/late detect module 120B). Therefore, after the delay is added by replica variable delay module 130B, the output of replica variable delay module 130B causes the rising edge of clock signal 152A received at chip 102B, to be aligned with the falling edge of clock signal 152B at the early/late detect module 120B.

This approach according to one or more embodiments of the invention is different from changing the clock latency, which has a slower response time, in order to reduce jitter on the rest of the clock grid and is mostly to compensate for process, temperature, and long-term voltage variation.

Late mode is a different problem which is not addressed herein. A pre-requisite for embodiments of invention is that the clock is de-skewed to the extent it can be. All that is needed is to synchronize the clocks (by using a synchronized clock signal from clock source 106) or place the clocks in a good place at the start, and then the circuit 100 will keep the clock signals 152A and 152B aligned properly (in the right place) even if the skew increases. In one or more embodiments of the invention, the range of the circuit 100 is set to the expected delta delay (i.e., difference quantity 250) due to delta voltage. The step size can be set down to the resolution of the delay structure of choice, with a total range that is also fully programmable by the early/late detect module 120B.

Figure 3:
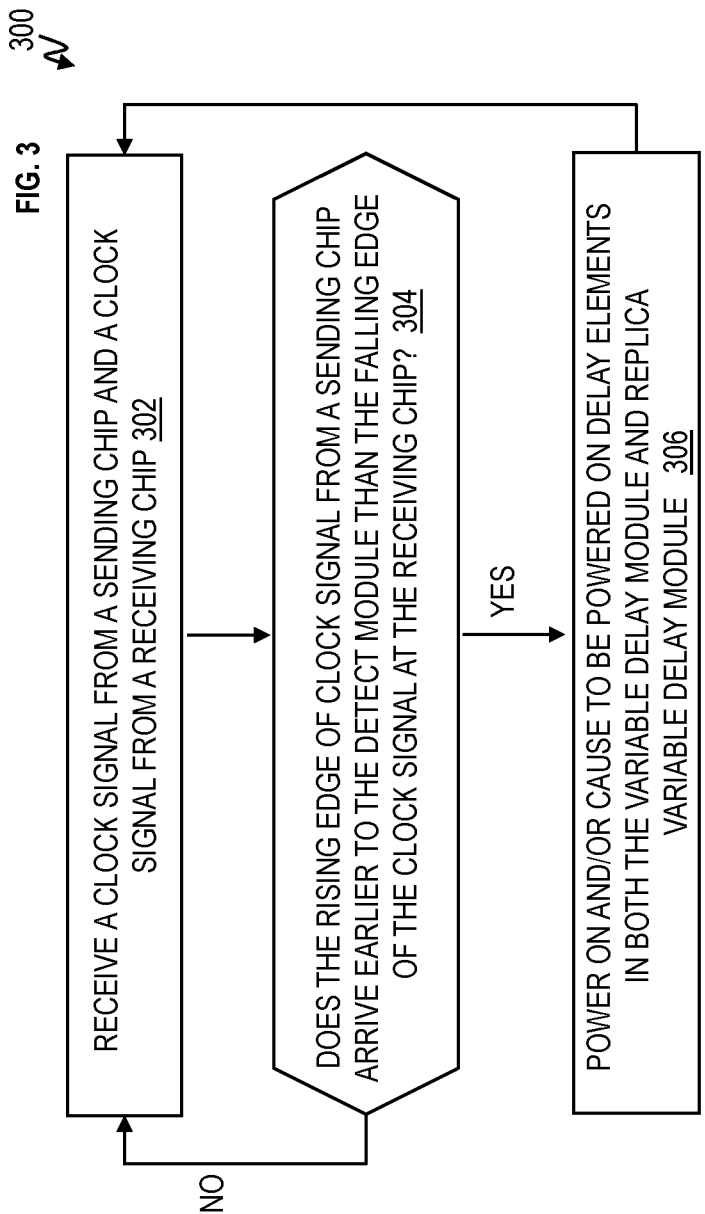
FIG. 3 illustrates a flow diagram of a process for early mode protection for synchronous interfaces in accordance with one or more embodiments of the present invention.

FIG. 3 illustrates a flow diagram of a process 300 for early mode protection for synchronous interfaces between two chips according to one or more embodiments of the invention. As discussed above, the process 300 applies for either chip 102A or 102B as the sending chip and the other chip as the receiving chip or vice versa. Continuing the example scenario discussed above, the chip 102A is illustrated as the sending chip and chip 102B is illustrated as the receiving chip but the reverse applies by analogy in accordance with embodiments.

At block 302, the early/late detect module 120B is configured to receive the clock signal 152A of the sending chip 102A and the clock signal 152B of the receiving chip 102B, while the data 150A is also being sent to receiving chip 102B. At block 304, the early/late detect module 120B is configured to determine the difference quantity 250 or amount time between the rising edge of clock signal 152A of the sending chip 102A received on chip 102B, and the falling edge of clock signal 152B of the receiving chip 102B (i.e., the falling edge appears as and/or is interpreted as a rising edge of clock signal 152B for comparison by the early/late detect module 120B).

When it is determined at block 304 that the arrival of the falling edge of clock signal 152B is equal to or early as compared to the rising edge of clock signal 152A received on chip 102B, the early/late detect module 120B continues monitoring the clock signals 152A and 152B. When it is determined at block 304 that the arrival of the rising edge of clock signal 152A of the sending chip 102A received on chip 102B is received earlier than and/or prior to the falling edge of clock signal 152B of the receiving chip 102B, the early/late detect module 120B is configured to power on and/or cause to be powered on delay elements in both the variable delay module 116B and replica variable delay module 130B at block 306. For example, the early/late detect module 120B may determine that the rising edge of clock signal 152A is arriving earlier in time to the early/late detect module 120B (which corresponds to the data 150A arriving earlier in time to the latch 118B) than the falling edge of clock signal 152B (arrives to the clock input of latch 118B) by X units of time (e.g., X picoseconds). Accordingly, the early/late detect module 120B is configured to power on and/or select, e.g., Y number of delay elements (such as, e.g., inverters, NAND gates, etc.) such that the added delay is equivalent to X units of time, and the added delay causes the data 150A from sending chip 102A to arrive at the latch 118B to meet the appropriate rising edge of the clock signal 152B. The delay added by early/late detect module 120B to the variable delay module 116B centers the data 150A with the rising edge of the clock signal 152B of (receiving) chip 102B, thereby causing the latch 118B to capture the data 150A at the center as depicted in FIG. 6. Since the data 150A on chip 102A is being launched off of the rising edge of clock 152A, and the two signals travel identical parallel paths to reach chip 102B, if the early/late detect module 120B delays that launching edge of clock 152A until it is at the falling edge of clock 152B then the transition of the data will also occur at that same falling edge of clock 152B. Therefore, if the data transition happens at the falling edge then the center of the data must occur half a cycle later, at the rising edge of clock 152B.

FIG. 5 illustrates a block diagram of example variable delay modules 116A, 116B and example replica delay modules 130A, 130B, which can include a delay line of delay elements 502A and 502B to provide variable digital delay. For example purposes, the delay elements 502A and 502B are illustrated as NAND gates but other types of logic gates can be utilized. The output of delay elements 502A are fed into one input of respective ones of the delay elements 502A until the last delay element 502A is reached. After the first of the data elements 502B, inverters 502C may be added on the data input line between the data elements 502B. The delay elements 502B can receive a selection signal (e.g., sel<0>, sel<1>, sel<2>) at one of its inputs to add the delay associated with the selected delay element 502B, while the data (e.g., data 150A, 150B) is input to the other input of the respective delay element 502B. In one or more embodiments, the select signals are encoded in a one-hot fashion, where only one select signal is high while the rest are low. The logic circuits 204 of the early/late detect module 120B (and analogously the early/late detect module 120A) can send the selection commands/signals (e.g., sel<0>, sel<1>, sel<2>) to cause the appropriate number of delay elements 502B (and its associated delay element 502A) to be added in order to meet the time needed for the difference quantity 250. Example delay elements 502A and 502B are each operable to add predetermined amounts/units of delay in the delay line. There are many different embodiments of variable delay modules, and it should be understood that FIG. 5 is merely one example.

As noted above, the example scenario discusses chip 102A as the sending chip and the chip 102B as the receiving chip. Various examples are not meant to be limited because both chips 102A and 102B are continuously sending and receiving data and clock signals, and the same functions and operations can occur on both chips according to one or more embodiments discussed herein. The functions and operations of the following elements of chip 102A, clock tree 108A, clock signal 152A, data 150A, latch 110A, driver 112A, driver 124A, receiver 126A, inverter 128A, replica variable delay module 130A, early/late detect module 120A, receiver 114A, variable delay module 116A, and latch 118A apply by analogy to chip 102B, clock tree 108B, clock signal 152B, data 150A, latch 110B, driver 112B, driver 124B, receiver 126B, inverter 128B, replica variable delay module 130B, early/late detect module 120B, receiver 114B, variable delay module 116B, and latch 118B (and vice versa).

One or more functions and operations of the replica variable delay modules 130A, 130B, early/late detect modules 120A, 120B, and/or variable delay modules 116A, 116B can be implemented using circuits including logic circuits, modules, memory elements, processors/microprocessors, etc. The various components, modules, engines, etc., that may be utilized in FIGS. 1-6 can be implemented as instructions stored on a computer-readable storage medium, as hardware modules, as special-purpose hardware (e.g., application specific hardware, application specific integrated circuits (ASICs), as embedded controllers, hardwired circuitry, etc.), or as some combination or combinations of these. In examples, the engine(s) described herein can be a combination of hardware and programming. The programming can be processor executable instructions stored on a tangible memory, and the hardware can include processing circuitry for executing those instructions. Thus a system memory can store program instructions that when executed by processing circuitry implement the engines described herein. Other engines can also be utilized to include other features and functionality described in other examples herein. Alternatively or additionally, the modules can include dedicated hardware, such as one or more integrated circuits, Application Specific Integrated Circuits (ASICs), Application Specific Special Processors (ASSPs), Field Programmable Gate Arrays (FPGAs), or any combination of the foregoing examples of dedicated hardware, for performing the techniques described herein.

Figure 4:
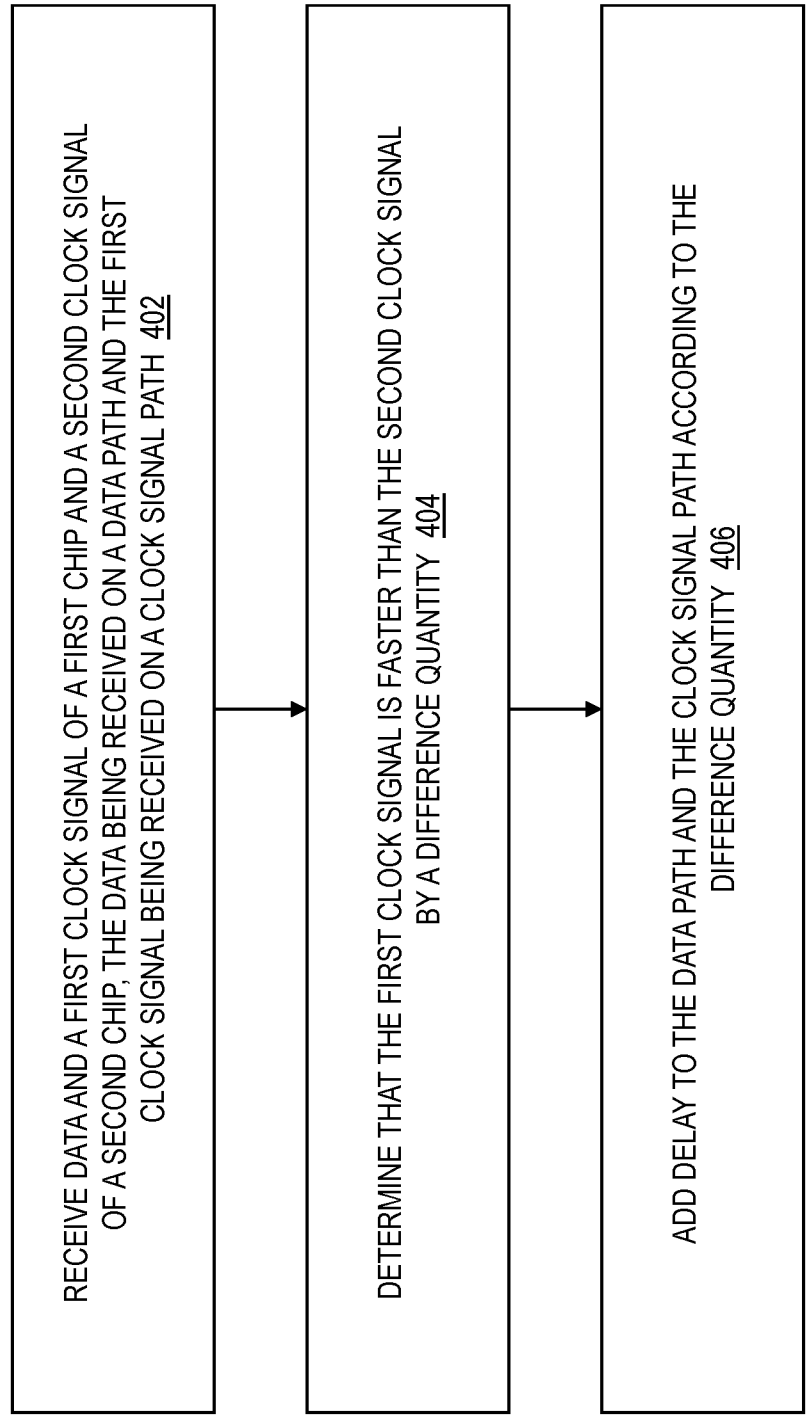
FIG. 4 illustrates a flow diagram of a method for early mode protection for a circuit in accordance with one or more embodiments of the present invention.

FIG. 4 illustrates a flow diagram 400 of a method for early mode protection for a circuit 100 according to one or more embodiments of the invention. At block 402, the chip 102B (as the receiving chip) is configured to receive data (e.g., data 150A) and a first clock signal (e.g., clock signal 152A) of a first chip (e.g., chip 102A) and a second clock signal (e.g., clock signal 152B) of a second chip (e.g., chip 102B), the data being received on a data path (e.g., (any part of) the data path from latch 110A to latch 118B) and the first clock signal being received on a clock signal path (e.g., (any part of) the clock signal path from clock tree 108A to early/late detect module 120B).

At block 404, the early/late detect module 120B of chip 102B is configured to determine that the first clock signal (e.g., clock signal 152A) is arriving faster than (or before) the second clock signal (e.g., 152B) by a difference quantity 250. For example, arriving faster or before can refer to a rising edge of a cyclical waveform of the clock signal 152A being further advanced in time than a falling edge of a cyclical waveform of the clock signal 152B (i.e., the falling edge appears as and/or is interpreted as a rising edge of clock signal 152B for comparison by the early/late detect module 120B), such that the clock signal 152A causes data 150A to arrive at the latch 118B prior to an indication (e.g., the rising edge) of the clock signal 152B arriving at the latch 118B to open the latch 118B.

At block 406, the early/late detect module 120B of chip 102B is configured to add delay to the data path (e.g., via variable delay module 116B) and the clock signal path (e.g., via replica variable delay module 130B) according to the difference quantity 250.

The data path is between the first chip (e.g., chip 102A) and the second chip (e.g., chip 102B). A portion of the data path is on the first chip (e.g., chip 102A), and a portion of the data path is on the second chip (e.g., chip 102B). The delay is added to the data path on the second chip via variable delay module 116B. The delay is added to the clock signal path on the second chip via replica variable delay module 130B.

Adding delay to the data path and the clock signal path according to the difference quantity comprising adjusting a variable delay module (e.g., variable delay module 116B) on the data path and a replica variable delay module (e.g., replica variable delay module 130B) on the clock signal path. The replica variable delay module is a duplicate of the variable delay module.

The second chip (e.g., chip 102B) comprises a variable delay module, the delay being added to the data path by the variable delay module. The second chip comprises a replica variable delay module, the delay being added to the clock signal path by the replica variable delay module. The second chip comprises a detect module (e.g., early/late detect module 120B) which is analogous to earl/late detect module 120A), the detect module being configured to determine that the first clock signal (e.g., clock signal 152A) is faster than the second clock signal (e.g., clock signal 152B) by the difference quantity 250.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

One or more of the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method comprising:
   receiving data and a first clock signal of a first chip and a second clock signal of a second chip, the data being received on a data path and the first clock signal being received on a clock signal path;

determining that the first clock signal is arriving before the second clock signal by a difference quantity; and adding delay to the data path and the clock signal path according to the difference quantity.

2. The method of claim 1, wherein the data path is between the first chip and the second chip.

3. The method of claim 1, wherein a portion of the data path is on the first chip.

4. The method of claim 1, wherein a portion of the data path is on the second chip.

5. The method of claim 1, wherein the delay is added to the data path on the second chip.

6. The method of claim 1, wherein the delay is added to the clock signal path on the second chip.

7. The method of claim 1, wherein adding delay to the data path and the clock signal path according to the difference quantity comprises adjusting a variable delay module on the data path and a replica variable delay module on the clock signal path.

8. The method of claim 7, wherein the replica variable delay module is a duplicate of the variable delay module.

9. The method of claim 1, wherein the second chip comprises a variable delay module, the delay being added to the data path by the variable delay module.

10. The method of claim 9, wherein the second chip comprises a replica variable delay module, the delay being added to the clock signal path by the replica variable delay module.

11. The method of claim 1, wherein the second chip comprises a detect module, the detect module being configured to determine that the first clock signal is arriving before than the second clock signal by the difference quantity.

12. An apparatus comprising:

a first chip and a second chip; and a detect module of the second chip configured to receive a first clock signal of the first chip and a second clock signal of the second chip, data being associated with a data path and the first clock signal being associated with a clock signal path;

wherein the detect module is configured to determine that the first clock signal is arriving before the second clock signal by a difference quantity and add delay to the data path and the clock signal path according to the difference quantity.

13. The apparatus of claim 12, wherein the data path is between the first chip and the second chip.

14. The apparatus of claim 12, wherein a portion of the data path is on the first chip.

15. The apparatus of claim 12, wherein a portion of the data path is on the second chip.

16. The apparatus of claim 12, further comprising a variable delay module on the data path and a replica variable delay module on the clock signal path.

17. The apparatus of claim 16, wherein the variable delay module is configured to be adjusted to add the delay on the data path.

18. The apparatus of claim 16, wherein the replica variable delay module is configured to be adjusted to add the delay on the clock signal path.

19. The apparatus of claim 16, wherein the replica variable delay module is a duplicate of the variable delay module.

20. An apparatus comprising:

a variable delay module on a data path for data;

a replica variable delay module on a clock signal path for a first clock signal of a first chip; and a detect module coupled to the variable delay module and the replica variable delay module, the detect module being configured to determine that the first clock signal is arriving before a second clock signal of a second chip by a difference quantity, wherein the detect module is configured to add delay to the variable delay module and the replica variable delay module according to the difference quantity.

* * * * *